United States Patent [19]

Shlichta

[11] 4,330,359

[45] May 18, 1982

[54] ELECTROMIGRATION PROCESS FOR THE PURIFICATION OF MOLTEN SILICON DURING CRYSTAL GROWTH

[76] Inventor: Alan M. Lovelace, Administrator of the National Aeronautics and Space Administration, with respect to an invention of Paul J. Shlichta, San Pedro, Calif.

[21] Appl. No.: 233,269

[22] Filed: Feb. 10, 1981

[51] Int. Cl.³ .............................................. C30B 15/34
[52] U.S. Cl. .................................. 156/608; 156/602; 422/246
[58] Field of Search ................ 148/173; 156/602, 608, 156/617 SP; 422/246, 249

[56] References Cited

U.S. PATENT DOCUMENTS

| | | | |
|---|---|---|---|
| 2,842,467 | 7/1958 | Landaver et al. | 156/602 |
| 3,058,915 | 10/1962 | Bennett | 156/602 |
| 3,346,344 | 10/1967 | Levinstein et al. | 156/602 |
| 3,453,088 | 7/1969 | Lebek | 156/602 |
| 3,935,058 | 1/1976 | Kuhlmann-Schafer | 156/608 |
| 4,116,641 | 9/1978 | Ciszek | 156/608 |

FOREIGN PATENT DOCUMENTS

| | | | |
|---|---|---|---|
| 52-76277 | 6/1977 | Japan | 156/608 |
| 2041781 | 9/1980 | United Kingdom | 156/608 |

*Primary Examiner*—Gregory N. Clements
*Attorney, Agent, or Firm*—Thomas H. Jones; John R. Manning

[57] ABSTRACT

A process for the purification of molten materials during crystal growth by electromigration of impurities to localized dirty zones. The process has particular applications for silicon crystal growth according to Czochralski techniques and edge-defined film-fed growth (EFG) conditions. In the Czochralski crystal growing process, the impurities are electromigrated away from the crystallization interface by applying a direct electrical current to the molten silicon for electromigrating the charged impurities away from the crystal growth interface.

In the EFG crystal growth process, a direct electrical current is applied between the two faces which are used in forming the molten silicon into a ribbon. The impurities are thereby migrated to one side only of the crystal ribbon. The impurities may be removed or left in place. If left in place, they will not adversely affect the ribbon when used in solar collectors. The migration of the impurity to one side only of the silicon ribbon is especially suitable for use with asymmetric dies which preferentially crystallize uncharged impurities along one side or face of the ribbon.

11 Claims, 4 Drawing Figures

ELECTROMIGRATION PROCESS FOR THE PURIFICATION OF MOLTEN SILICON DURING CRYSTAL GROWTH

DESCRIPTION

1. Origin of the Invention

The invention described herein was made in the performance of work under an Interagency agreement between the Department of Energy and the National Aeronautics and Space Administration in continuation of the work under NASA prime contract NAS7-100 between NASA and the California Institute of Technology, and is subject to the provisions of Section 305 of the National Aeronautics and Space Act of 1958, Public Law 83-568 (72 Statute 435: 42 USC 2457).

2. Technical Field

The present invention relates to processes for purifying molten silicon during crystal growth. More particularly, the present invention relates to purification of molten silicon by electromigration and localized concentration of impurities.

3. Background Art

Self-sufficiency in energy is a stated national goal. Many of the proposed means to achieve this goal, especially those dependent on fossil fuels, are either environmentally unacceptable or not feasible.

Of the available alternatives, solar energy is the most abundant, inexhaustable single resource available. However, capturing and utilizing solar energy is not simple. Methods are being sought to convert solar energy to a concentrated, storable form of energy.

One method of converting solar energy to a usable form being prominently considered is the deployment of large arrays of photovoltaic solar cells, especially in the sunbelt areas such as the southwestern and western regions of the United States. The most promising candidate for the solar cell is a doped silicon material.

Silicon is one of the most plentiful elements in the earth's crust. However, solar cells are presently fabricated from semiconductor-grade silicon, which has a market price of about $65.00 per kilogram. A number of current projects are directed to developing the national capability to produce low-cost, long-life photovoltaic modules at a rate greater than 500 MW per year and at a price of less than $500 per peak kilowatt by the year 1986. A drastic reduction in price of material is necessary to meet these important national objectives. The presence of transition metal impurities has been identified as one of the major factors causing degradation of silicon photovoltaic cells. These impurities have a negative effect on the carrier lifetime and also on the efficiency of silicon cells. Both of these factors have been considered as inter-related critical limitations. The minimization of all transition-metal impurities is a major concern in the production of silicon sheet for widespread use in solar arrays.

In practice it has been found that initially transition metal impurities are preferentially rejected by the growing crystal. An impurity build-up then occurs in the melt as crystallization proceeds. Typically crystal grown from the last fraction of the melt has unacceptably high impurity levels and short carrier lifetimes. The effect is aggravated in continuous feed and multiple-batch runs. In the continuous-feed EFG process, for example, increasing levels of impurities make it necessary to shut down the operation. In multiple-beach Czochralski runs the final portion of each crystal usually has unacceptably high impurity levels and must be discarded, in part because crucible preservation requires complete crystallization of the melt between charges.

A number of techniques are presently available to prevent excessive impurity levels. As an example, ultrapure starting material may be prepared; however, aside from intrinsic limitations in the necessary chemical purification processes, more stringent purification techniques would severly increase the cost of production. Floating zone melting may also be used to remove all critical impurities, but it too is prohibitively expensive. In addition, impurity removal by rapid crystallization is also available since impurities would in theory be sequestered by spurts of very rapid crystallization. This, however, entails not only discarding portions of the crystal but also interruption of the process, since rapid growth usually becomes polycrystalline. All of the above methods are either prohibitively expensive or impractical.

SUMMARY OF THE INVENTION

In accordance with the present invention, high purity single crystals of a material such as silicon are produced by segregation of the metallic impurities in the molten material by electromigration. The present invention requires no special purification of the starting material, does not interrupt or interfere with the crystal growing process and does not require any substantial complication of existing crystal growing processes or any additional operator attention.

The present invention is based upon the application of an electric field to a molten melt from which high purity single crystals of material are being grown. The application of the electric field results in electromigration of charged impurities. Electrodes utilized in applying the electric field are positioned so that the charged impurities either migrate away from the crystal formation zone or are segregated from pure material in a localized dirty zone during crystallization.

The present application has specific applications to Czochralski techniques and edge-defined film-fed growth (EFG) conditions. The present invention is especially applicable to production of high purity silicon crystals but may equally as well be applied to other elementary systems such as molybdenum, germanium and tellurium.

As a feature of the present invention, the electrical current applied to remove impurities by electromigration, causes ohmic heating of the molten material. This is energy and cost-effective since the ohmic heating contributes to the heating of the molten material.

The above-discussed features and attendant advantages along with other features and attendant advantages will become better understood by reference to the following detailed description. The detailed description includes drawings which will first be briefly described.

DETAILED DESCRIPTION OF THE INVENTION

Figure 1:
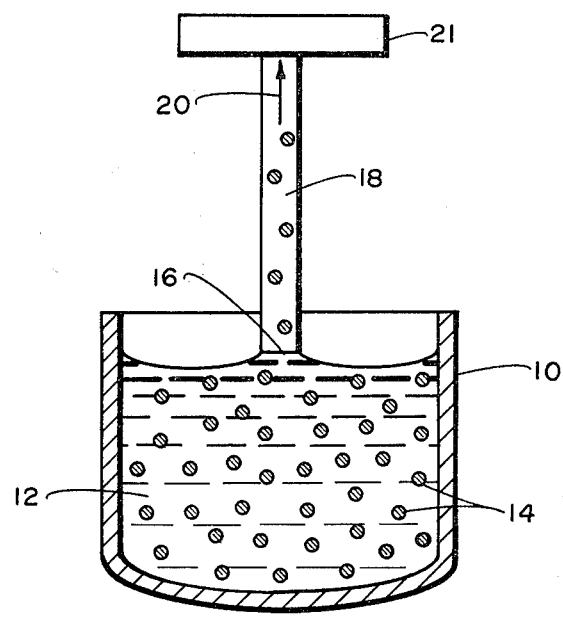
FIG. 1 is a diagrammatic representation of a typical Czochralski crystal-growing process.

FIG. 1 is a representation of the well-known Czochralski technique for growing crystals. In general, the material to be crystallized is heated within a crucible 10 to form a molten 12. Molten melts may be formed from any of the various elementary systems such as silicon, germanium, telurium and others. Melts composed of binary systems may also be utilized in accordance with the present invention; however, it is not known with certainty whether or not binary systems including various alloys would be as appropriate as the elementary systems. Preferably, the molten melt is composed of silicon. Therefore, the following discussions will be limited to silicon crystal growth; however, it will be understood that the present invention is not limited to silicon systems but may be applied to other elementary and binary systems.

Referring again to FIG. 1, the silicon which is typically used to form melt 12 contains transition metal impurities such as molybdenum, and chromium,. Further, the silicon may contain alkali metal impurities and boron impurities. It is believed that these transition metal impurities in molten silicon are present in the form of $MSi_x$ ions where M is any of the known typical transition metal impurities. These impurities are represented diagrammatically in FIG. 1 at 14. The size of impurities 14 are grossly exaggerated in the figures for demonstration purposes. The impurities in actuality are of an atomic or molecular nature with impurity dimensions being accordingly of atomic and molecular sizes. Also, the impurities are shown as being negatively charged. However, certain impurities may also carry a net positive charge. The present invention may be applied in migrating either type of impurity.

In the Czochralski technique, a crystal interface 16 is formed by well-known techniques using a seed crystal or the like. As silicon crystallizes at the crystal interface 16, a single silicon crystal 18 is drawn upward in the direction of arrow 20 by suitable crystal pulling apparatus shown diagrammatically at 21. Silicon from melt 12 is continually withdrawn as silicon crystal 18 until the silicon melt 12 is depleted. Initially, the transition metal impurities 14 are preferentially rejected from the crystal 18. As the amount of silicon in the melt decreases during crystal formation, a buildup in impurities occurs. This results in impurities 14 being dispersed and crystallized within silicon crystal 18. In accordance with the present invention, a direct electrical current is applied across the silicon melt to cause electromigration of the undesired transition metal impurities to a location away from the crystal interface 16. The applicant believes the electromigration is due to electron-momentum transfer and due to the net negative charge which is believed to be associated with transition metal/silicon ions of the formula $MSi_x$. Although many different possible electrode systems are available and would be suitable for migrating the transition metal impurities 14 away from the crystal interface 16, the preferred electrode configuration is shown in FIG. 2.

Figure 2:
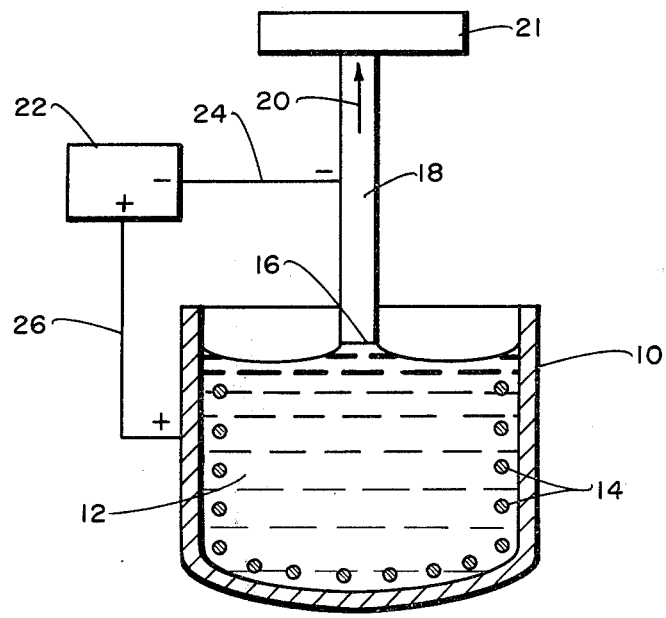
FIG. 2 is a diagrammatic representation of the present invention as applied to the Czochralski process of FIG. 1.

As shown in FIG. 2, a direct current power source 22 is provided for applying a direct electrical current to the silicon melt 12. Preferably, the emerging silicon crystal 18 forms the negative electrode while the crucible 10 is preferred as the positive electrode. The polarity of the electrodes may be reversed if positively charged impurities are to be removed. Appropriate electrical current is applied to the crystal 18 and crucible 10 by way of electrical lines 24 and 26. Upon application of electrical current from direct current power source 22, the negatively charged transition metal impurities 14 will migrate towards and adjacent to the crucible 10. This insures that the impurities are concentrated away from the crystal interface 16. It is expected that the transition metal impurities will have migration velocities of about $4 \times 10^{-5}$ centimeters per second at a current density of 10 A/cm² for typical Czochralski apparatus dimensions and growth rates, it is estimated that effective impurities segregation would require current densities of about 300 A/cm² for convectionless Czochralski growth. This translates into direct current power inputs of over 100 KVA for Czochralski growth. Applied DC voltages could be on the order of 1 to 10 volts at a current of over 100 amps. At these voltages and currents, resistance heating of the crystal and Peltier heating at the crystal growth interface 16 would be expected to occur. Additionally, resistive heating of the melt 12 would also be expected. The Peltier heating may be expected to affect the crystal growth characteristics, however, the advantages or disadvantages of such heating are not yet well defined.

Another type of well-known crystal growth technique is the edge-defined film-fed growth (EFG) technique. A basic EFG system is shown diagrammatically in FIG. 3. The EFG system is similar to the Czochralski technique except for the provision of pulling the silicon crystal from between special dies to form a silicon ribbon. A crucible 28 is provided in which the silicon melt 30 is raised to sufficient temperatures to form the molten silicon. Transition melt impurities are again represented by exaggerated impurities 32. These impurities, like the impurities 14 in FIGS. 1 and 2 are atomic and molecular in nature but are shown in exaggerated size for demonstration purposes. The molten silicon is drawn up through die means such as the die shown generally at 34 by crystal pulling apparatus diagramatically shown at 35. The die means includes die halves 36 and 38. A passageway 40 is provided through the die 34. The molten silicon is drawn up through the passageway 40 to shape the molten silicon into a ribbon. Typically, the ribbon is from two to three inches wide and 0.2 to 1.0 millimeters thick. The die halves 36 and 38 are provided with die faces 42 and 44 respectively. The die faces 42 and 44 are spaced apart to form a ribbon of the desired thickness. As the molten silicon ribbon exits the top of passageway 40, it is crystallized at a crystal growth interface 46 to form a single silicon crystal 48 which is pulled upward in the direction of arrow 50. Impurities 32 present in the silicon melt 30 travel upward through the passageway 40 and are crystallized to the silicon crystal 48.

It would be possible in accordance with the present invention to provide a direct current power source utilizing the forming silicon crystal 48 as one electrode and the crucible 28 as the other electrode to provide localization of the impurities next to the crucible 28 as was done in FIG. 2. However, even though the majority of silicon crystal produced in this fashion is of an ultrapure nature having no impurities, the final portion of molten silicon pulled from the melt will include a high concentration of impurities and must be discarded.

In order to overcome this problem of having to discard the final portion of silicon crystals, it would be desirable to localize the impurities on one side only of the silicon ribbon crystal 48. Since the usual practice is to expose one side only of the silicon crystal to sunlight while the other side is attached to a supporting substrate, it is not critical that one side of the silicon ribbon crystal 48 has impurities lodged therein.

Figure 4:
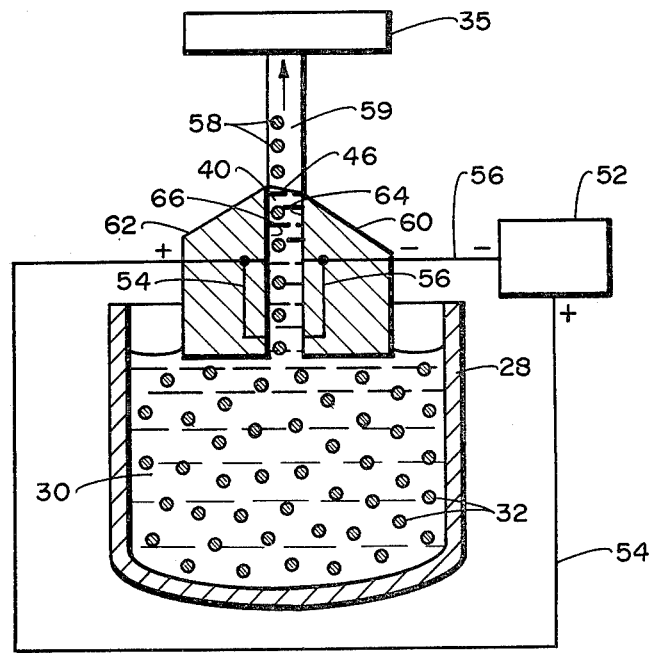
FIG. 4 is a diagrammatic representation of the present invention and its application to the EFG process of utilizing an assymetric die.

A preferred embodiment of the present invention is shown diagrammatically in FIG. 4. A direct current power source is shown at 52. The power source 52 is connected by suitable electrical wires or connections to sheath electrodes 54 and 56. The polarity of the power source 52 is such that electrode 54 is positive and electrode 56 is negative. This may be reversed in some cases where impurities having a net positive charge are present. The electrodes 54 and 56 may be made from any suitable electrode material with silicon carbide being preferred. As depicted in FIG. 4, the transition metal impurities having a net negative charge are electromigrated towards the positive electrode 54 as the moltened silicon moves upward through passageway 40. The migrating impurities, form an impure layer 58 along one side of the silicon ribbon 59. In this way, the impurities are moved to an extreme side of the silicon ribbon 59 where they do not interfere with operation of the silicon ribbons as solar cells or otherwise.

Power inputs of less than 1 KVA to the electrodes 54 and 56 is expected. Peltier heating effects would be transverse to the growth direction of crystal 59 and are quite minor for silicon ribbon growth in this configuration. Again applied DC voltages could be on the order of 1 to 10 volts.

Figure 3:
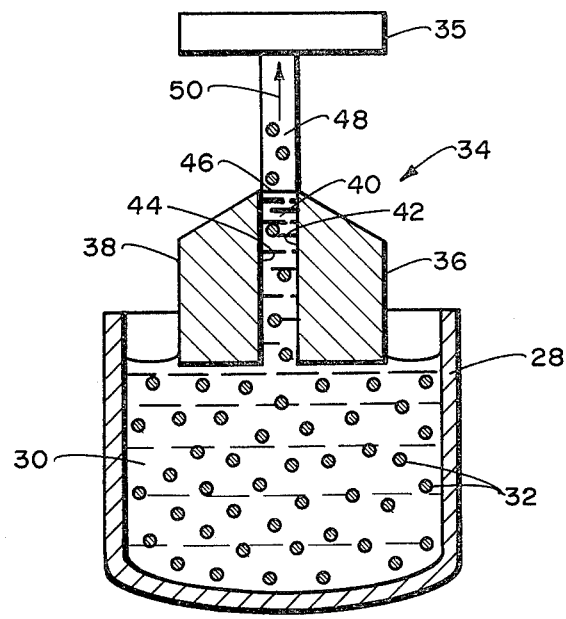
FIG. 3 is a diagrammatic representation of an edge-defined film-fed growth crystal growing process.

In another feature of the present invention, the die halves 38 and 36 shown in FIG. 3 are modified to form assymetric die halves 60 and 62 into FIG. 4. It has been found that by staggering the die faces as shown at 64 and 66 to form an assymetric die, that uncharged impurities within the molten ribbon of silicon preferentially are crystallized on the side of the ribbon nearest die face 66. As will be realized, by inducing the polarity indicated in FIG. 4, the present invention provides for electromigration of negatively charged transition metal impurities to the same dirty layer 58 as the non-charged impurities such as carbon or the like which are preferentially crystallized in dirty layer 58 by the asymmetric die design shown in FIG. 4. A detailed description of the assymetric die design and its operation is set forth in U.S. patent application Ser. No. 011,527 filed Feb. 27, 1979 entitled Displaced Capillary Dies, Kalejs et al. inventors. The content of which is hereby specifically incorporated by reference. By combining the assymetric die with the electromigration of the present invention, both charged and uncharged impurities can be crystallized on the same side of the ribbon 59 in one convenient step.

If it is desired to produce a silicon ribbon which does not have concentrated impurities along one face, the impure layer 58 may be removed by suitable removal technique such as cutting, grinding or etching; however, these techniques may be too time consuming and costly.

Having thus described exemplary embodiments of the present invention, it should be noted by those skilled in the art that the within disclosures are exemplary only and that various other alternatives, adaptations and modifications may be made within the scope of the present invention. Thus, by way of example and not of limitation, any number of electrode configurations may be devised to preferentially migrate impurities to various specialized locations within the melt or within the crystal to provide portions of pure silicon crystal and impure crystal as desired. Accordingly, the present invention is not limited to the specific embodiments as illustrated herein.

What is claimed is:

1. A process for producing high purity crystals of a material from a molten melt of said material having impurities dispersed therein comprising the steps of:

heating said material to a temperature sufficient to form a molten melt, said melt having a crystallization zone with a crystal growth interface where said molten material is crystallized to form said crystals;

crystallizing said molten material at said crystal growth interface to form said crystals;

pulling said crystal outwardly from said crystal interface through a die at a rate sufficient to form a continuously extending crystal ribbon; and said die body having a passageway passing transversely therethrough, said body having first and second interior faces defining the sides of said passageway and said passageway further having a bottom for receiving said molten material and a top where said molten material crystallizes and exits said die body as said ribbon;

concentrating said impurities within said molten material adjacent said faces by electromigration by applying direct electrical current between said first and second faces whereby said crystals of material are segregated into a high purity portion and a relatively impure portion along at least one of the sides of said crystal.

2. A process according to claim 1 wherein the interior faces are staggered to provide a passageway top which is at an oblique angle relative the direction of movement of said crystal as it exits the passageway top whereby uncharged impurities are concentrated along one side of said crystal.

3. A process according to claim 2 wherein said faces are staggered and said electrical current applied between said faces to produce a crystal having said net negatively charged impurities and said uncharged impurities along the same side of said crystal.

4. A process according to claim 1 wherein said first face is positively charged and said second face is negatively charged so that impurities within said passageway having a net negative charge electromigrate towards said first face.

5. A process according to claim 1 wherein said electrical current is applied to first and second conductive sheath electrodes on said first and second die body faces respectively whereby the charged impurities in said melt electromigrate towards and adjacent to at least one of said conductive sheath electrodes.

6. A process according to claim 1 wherein said material is silicon.

7. A process according to claim 1 including the additional step of separating the high purity portion from said impure portion.

8. An apparatus for producing high purity crystals of a material from a molten melt of said material having impurities dispersed therein comprising:

means for heating said material to a temperature sufficient to form a molten melt, said melt having a crystallization zone with a crystal growth interface where said molten material is crystallized to form crystals;

means for pulling said crystal outwardly from said crystal interface through a die means at a rate sufficient to form a continuously extending crystal;

said die means for passing said molten material therethrough for shaping said molten material into a ribbon prior to crystallization including a die body having a passageway passing transversely therethrough, said die body having first and second interior faces defining the sides of said passageway and said passageway further having a bottom for receiving said molten material and a top where said molten material crystallizes and exits said die body; and means for concentrating said impurities within said molten material adjacent said faces by electromigration means including electrical current means for providing a direct electrical current between said first and second faces whereby said crystals of material are segregated into a high purity portion and a relatively impure portion along at least one side of said crystal.

9. An apparatus according to claim 8 wherein the interior faces are staggered to provide a passageway top which is at an oblique angle relative the direction of movement of said crystal as it exits the passageway top whereby uncharged impurities are concentrated along one side of said crystal.

10. An apparatus according to claim 9 wherein said faces are staggered and said electrical current applied between said faces to produce a crystal having said net negatively charged impurities and said uncharged impurities along the same side of said crystal.

11. An apparatus according to claim 10 wherein said first face is positively charged and said second face is negatively charged so that impurities within said passageway having a net negative charge electromigrate toward said first face.

* * * * *